United States Patent [19]

Vogelsong et al.

[11] 4,383,187
[45] May 10, 1983

[54] CHARGE TRANSFER FILTER PROVIDING RECURSIVE TRANSFER FUNCTIONS

[75] Inventors: Thomas L. Vogelsong, Schenectady; William E. Engeler, Scotia, both of N.Y.

[73] Assignee: General Electric Company, Schenectady, N.Y.

[21] Appl. No.: 264,250

[22] Filed: May 18, 1981

Related U.S. Application Data

[63] Continuation-in-part of Ser. No. 134,175, Mar. 26, 1980, abandoned.

[51] Int. Cl.³ .................... G11C 19/28; H01L 29/78; H03H 15/02
[52] U.S. Cl. .................................... 377/57; 357/24; 333/165
[58] Field of Search ............... 357/24 R; 307/221 D; 333/165

[56] References Cited

U.S. PATENT DOCUMENTS

| | | | |
|---|---|---|---|
| 4,124,861 | 11/1978 | Baertsch et al. | 357/24 R |
| 4,124,862 | 11/1978 | Engeler et al. | 357/24 R |
| 4,259,596 | 3/1981 | Tiemann | 357/24 R |
| 4,259,597 | 3/1981 | Tiemann | 357/24 R |
| 4,259,598 | 3/1981 | Tiemann et al. | 357/24 R |
| 4,321,481 | 3/1982 | Tiemann | 307/221 D |

FOREIGN PATENT DOCUMENTS 2004692 4/1979 United Kingdom ............. 357/24 R

*Primary Examiner*—Gene M. Munson
*Attorney, Agent, or Firm*—Julius J. Zaskalicky; James C. Davis, Jr.; Marvin Snyder

[57] ABSTRACT

A filter utilizing charge transfer devices for providing recursive transfer functions is described. The filter includes a circular charge transfer shift register having an even number N of stages, greater than two, a first charge transfer shift register, and a second charge transfer shift register. A first input stage is unidirectionally coupled to the first stage of the first shift register and is also bidirectionally coupled to the $N^{th}$ stage of the circular shift register. A second input stage is unidirectionally coupled to the first stage of the second shift register and is also bidirectionally coupled to the $(N/2)^{th}$ stage of the circular shift register. A first input sequence of packets of charge representing positive weight components of a signal is applied to the first input stage and a second input sequence of packets of charge representing negative weight components of the signal is applied to the second input stage. All three shift registers are clocked at the same frequency. At the end of each clocking cycle the charge stored in the $N^{th}$ stage of the circular shift register and in the first input stage are combined and divided into a first part contained in the first input stage, and a second part which is contained in the $N^{th}$ stage of the circular shift register. The first part of the combined charge is clocked into the first shift register and clocked from stage to stage thereof. The second part of the combined charge is clocked from stage to stage of the circular shift register. Similarly, at the end of each clocking cycle the charge stored in the $(N/2)^{th}$ stage of the circular shift register and in the second input stage are combined and divided into a first part contained in the second input stage, and a second part which is contained in the $(N/2)^{th}$ stage of the circular shift register. The first part of the combined charge is clocked into the second shift register and clocked from stage to stage thereof. The second part of the combined charge is clocked from stage to stage of the circular shift register. Charge division and collection means are provided at the various stages of the first shift register to divide and collect fractions of charge appearing in the various stages thereof. The charge collection means of the various stages are connected together and provide a first output sequence of packets of charge representing the positive components of an output signal. The aforementioned fractions represent the weighting coefficients of the various stages of the first shift register. The second charge transfer shift register is identical to the first shift register. The charge collection means of the various stages of the second shift register are also connected together and provide a second output sequence of packets representing the negative components of the output signal.

10 Claims, 10 Drawing Figures

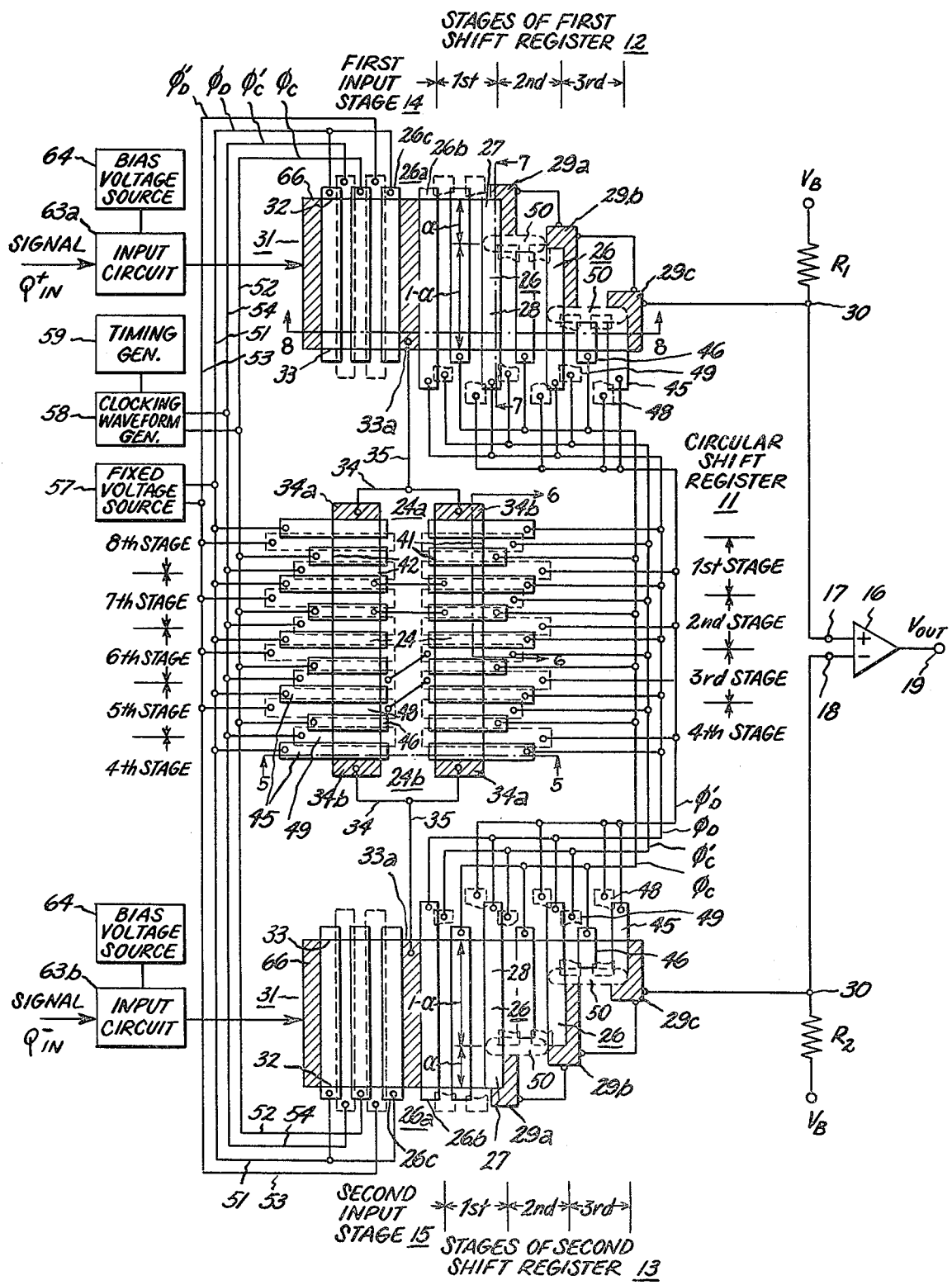

CHARGE TRANSFER FILTER PROVIDING RECURSIVE TRANSFER FUNCTIONS

This patent application is a continuation-in-part of patent application Ser. No. 134,175, filed Mar. 26, 1980, now abandoned.

The present invention is related in general to charge transfer signal processing apparatus and more particularly to such apparatus for implementing resonant transfer characteristics.

This patent application is related to patent application Ser. No. 105,757, filed Dec. 20, 1979, now U.S. Pat. No. 4,259,596, and assigned to the assignee of the present invention.

An object of the present invention is to provide sampled data filter apparatus which provides impulse responses of infinite duration.

Another object of the present invention is to provide sampled data filter apparatus which can implement a general class of infinite impulse response functions which are products of decaying exponentials multiplied by arbitrary functions of alternating polarity.

Another object of the present invention is to provide sampled data filter apparatus for implementing an impulse response that is an exact sampled data approximation of a decaying sinusoid.

Another object of the present invention is to provide sampled data filter apparatus in which both the input and output thereof are packets of charge whereby the cascading of such filters is simplified.

Another object of the present invention is to provide improvements in the organization and operation of the elements of a sampled data filter apparatus of the character described.

Another object of the present invention is to provide a sampled data filter of improved linearity.

A further object of the present invention is to provide sampled data filter apparatus which is capable of operation at extremely high frequencies.

In carrying out the present invention in one illustrative embodiment thereof there is provided a first plurality of first charge storage cells arranged in a sequence. Means are provided for dividing each of the first charge storage cells of the first plurality into a plurality of parts such that the ratio of the charge stored within a first part thereof to the sum of the charges stored within all of the parts thereof is equal to a respective one of a first sequential series of predetermined values. The first sequential series of predetermined values corresponds to a first series of weighting coefficients, each weighting coefficient for a respective first charge storage cell. The first plurality of first charge storage cells is serially coupled to form a first plurality of stages of a first charge transfer shift register, each stage including a respective first charge storage cell. A first plurality of collection means is provided with each collection means coupled to the first part of a respective first charge storage cell of the first plurality for collecting charge stored therein, selected ones of the first plurality of collecting means being connected in common. A first input stage including a first charge storage cell is provided and is coupled to the first stage of the first shift register.

A first input sequence of packets of charge is provided each packet representing a respective positive weight component of a sample of a signal. First introduction means are provided for introducing into the first charge storage cell of first input stage each of the packets of charge of the first input sequence.

A circular shift register having N stages is provided, where N is an even number greater than two, each stage including a first charge storage cell. Means are provided for transferring charge packets from first charge storage cell to first charge storage cell at the aforementioned frequency and in one direction in the circular shift register. The first introduction means are synchronized to provide storage of charge packets in the first charge storage cells of the first input stage, the first shift register and the circular shift register over a common interval of time, recurrent at the aforementioned frequency. First combining means including a conductive connection between the first charge storage cell of the first input stage and the first charge storage cell of the $N^{th}$ stage of the circular shift register are provided for combining the charge packet in the first charge storage cell of the first input stage with the charge packet in the first charge storage cell of the $N^{th}$ stage of the circular shift register during each of the common intervals of time to form a respective combined packet of charge. First transferring means are provided for periodically transferring at the aforementioned frequency a first part of each of the combined packets of charge to the first charge storage cell of the first stage of the first shift register and for simultaneously transferring at the aforementioned frequency a second part of each of the combined packets of charge to the first stage of the circular shift register. The first part of a combined packet of charge is equal to a first fixed fraction which is the ratio of the width of the first charge storage cell of the first input stage to the sum of the width of the first charge storage cell of the first input stage and the width of the first charge storage cell of the $N^{th}$ stage of the circular shift register. The second part of a combined packet of charge is equal to a second fixed fraction which is equal to the ratio of the width of the first charge storage cell of the $N^{th}$ stage of the circular shift register to the sum of the width of the first charge storage cell of the first input stage and the width of the first charge storage cell of the $N^{th}$ stage of the circular shift register. Means are provided for transferring the first parts of charge from stage to stage of the first shift register including transferring to each of the collection means of the first shift register a respective portion of each of the first parts of charge.

Thus, a first output sequence of packets of charge is collected by the collection means of the first plurality connected in common. This first output sequence of packets represents the filtered response of the first shift register and the circulating shift register to the first input sequence of packets.

A second plurality of first charge storage cells arranged in a sequence is provided. Means are provided for dividing each of said first charge storage cells of the second plurality into a plurality of parts such that the ratio of the charge stored within a first part thereof to the sum of the charges stored within all of the parts thereof is equal to a respective one of a second sequential series of predetermined values. The second sequential series of predetermined values corresponds to a second series of weighting coefficients, each weighting coefficient for a respective first charge storage cell. The second plurality of first charge storage cells is serially coupled to form a second plurality of stages of a second charge transfer shift register, each stage including a respective first charge storage cell. A second plurality of collection means is provided each collection means being coupled to the first part of a respective first charge storage cell of the second plurality for collecting charge stored therein, selected ones of the second plurality of collection means being connected in common. A second input stage is provided including a first charge storage cell coupled to the first stage of the second shift register. A second input sequence of packets of charge is provided, each packet representing a respective negative weight component of a sample of the aforementioned signal. Second introduction means are provided for introducing into the first storage cell of the second input stage each of the packets of charge of the second input sequence. The second introduction means are synchronized to provide storage of charge packets in the first charge storage cells of the second input stage, of the second shift register and of the circular shift register over aforementioned common interval of time, recurrent at the aforementioned frequency. Second combining means including a conductive connection between the first charge storage cell of the second input stage and the first charge storage cell of the $(N/2)^{th}$ stage of the circular shift register are provided for combining the charge packet in the first charge storage cell of said second input stage with the charge packet in the first charge storage cell of the $(N/2)^{th}$ stage of the circular shift register during each of the common intervals of time to form a respective combined packet of charge. Second transferring means are provided for periodically transferring at the aforementioned frequency a first part of each of the combined packets of charge to the first charge storage cell of the first stage of said second shift register and for simultaneously transferring at the aforementioned frequency a second part of each of the combined packets of charge to the stage of the circular shift register succeeding the $(N/2)^{th}$ stage thereof. The first part of a combined packet of charge is equal to the aforementioned first fixed fraction. The ratio of the width of the first charge storage cell of the second input stage to the sum of the width of the first charge storage cell of the second input stage and the width of the first charge storage cell of the $(N/2)^{th}$ stage of the circular shift register is equal to the aforementioned first fixed fraction. The second part of a combined packet of charge is equal to the aforementioned second fixed fraction. The ratio of the width of the first charge storage cell of the $(N/2)^{th}$ stage of the circular shift register to the sum of the width of the first charge storage cell of the second input stage and the width of the first charge storage cell of the $(N/2)^{th}$ stage of the circular shift register is equal to the aforementioned second fixed fraction. Means are provided for transferring the first parts of charge from stage to stage of the second shift register including transferring to each of the collection means of the second shift register a respective portion of each of the first parts of charge.

Thus, a second output sequence of packets of charge is collected by the collection means of the second plurality connected in common. This second output sequence of packets represents the filtered response of the second shift register and the circulating shift register to the second input sequence of packets.

Means are provided for deriving signal samples each of which represents the difference of the charge collected by the first collection means of the first plurality connected in common and the charge collected by the first collection means of the second plurality connected in common.

The novel features which are believed to be characteristic of the present invention are set forth with particularity in the appended claims. The invention itself, both as to its organization and method of operation, together with further objects and advantages thereof, may best be understood by reference to the accompanying drawings wherein:

FIG. 4 is a plan view of one embodiment of sampled data apparatus in accordance with the present invention.

Figure 1:
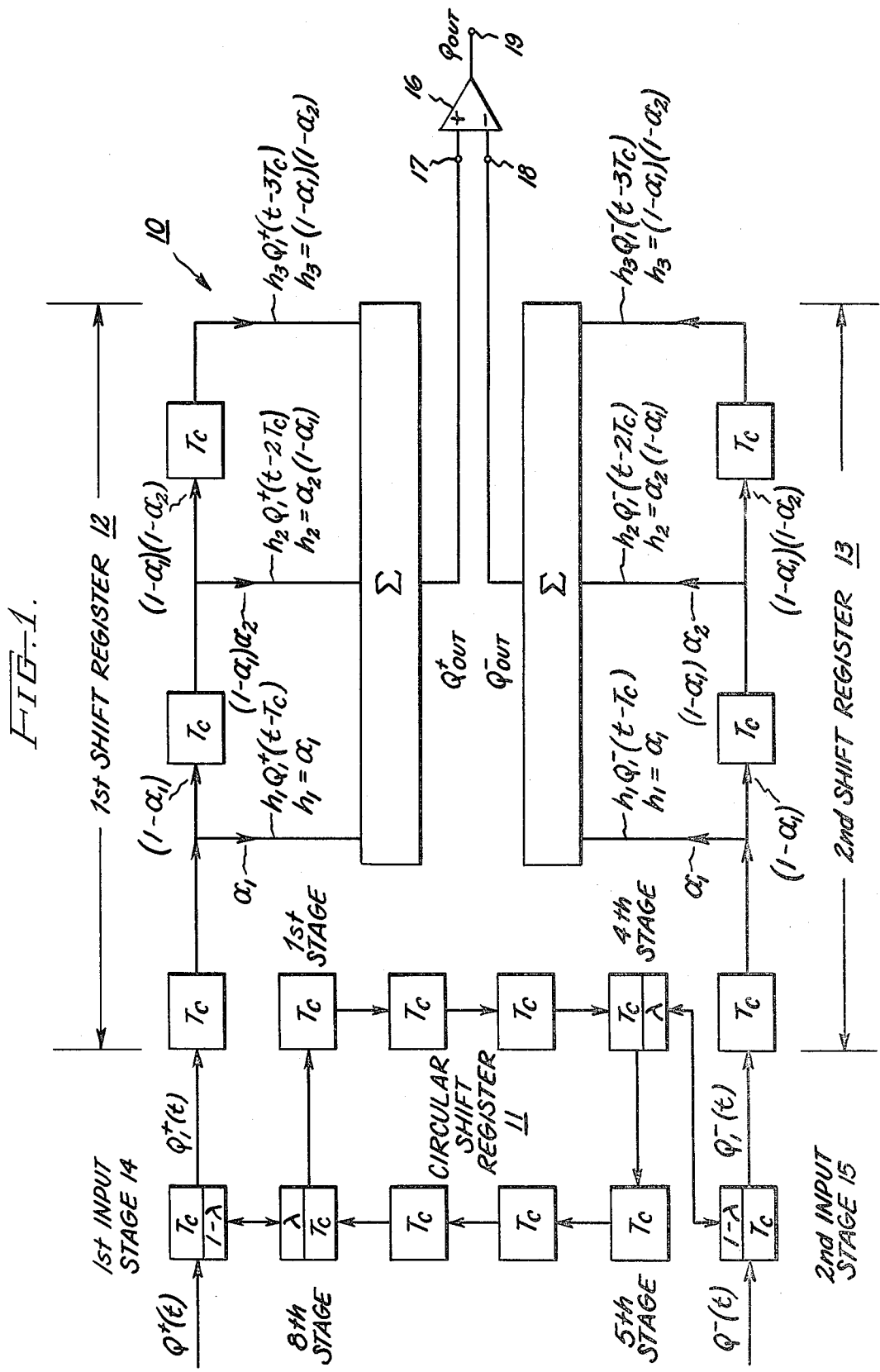
FIG. 1 is a block diagram of sampled data apparatus in accordance with the present invention.

Reference is now made to FIG. 1 which shows a functional block diagram of a sampled data recursive resonator with a single resonance for implementing a pair of complex conjugate poles in the system function of a sampled data filter. The recursive resonator provides an impulse response of the form:

$$f(t) = \left[ \sum_n (-\lambda)^n \delta\left(t - \frac{nT}{2}\right) \right] \times \left[ G(t); 0 < t < \frac{T}{2} \right] \quad (1)$$

where $\Sigma(-\lambda)^n\delta(T-n\,T/2)$ is a Comb function providing a sequence of samples of alternating polarity of decaying amplitude having a total period of T, each successive sample being a constant fraction of the previous sample, G(t) is an arbitrary sequence of single polarity having a period of T/2, and the symbol * between these functions indicates a convolution. The filter includes a circular charge transfer shift register 11 having eight stages, a first charge transfer shift register 12, and a second charge transfer shift register 13. A first input stage 14 is provided and is unidirectionally coupled to the first stage of the first shift register 12 and bidirectionally coupled to the eighth stage of the circular shift register 11.

All three shift registers and the first and second input stages are clocked at the same frequency and are synchronized so that storage of charge packets in the stages thereof occur over a common interval of time recurrent at the clocking frequency. Charge packets are clocked from stage to stage of the shift registers at a frequency $f_c$ with each stage providing a delay of $T_c$, where $T_c$ is equal to $1/f_c$. The storage capacity of the first input stage 14 and the storage capacity of the eighth stage of the circular shift register 11 are set such the charge clocked into these stages is combined and divided by the bidirectional coupling in accordance with the relative storage capacities of these stages. The ratio of the storage capacity of the eighth stage of the circular shift register to the sum of the storage capacity of the eighth stage of the circular shift register and the storage capacity of the first input stage is set to a fixed value $\lambda$. Thus, if a charge packet of unity value is clocked into the first input stage and if no charge packet is clocked into the eighth stage during the same clocking cycle, the charge packet is divided into a first part of value $(1-\lambda)$ stored in the first input stage and a second part $\lambda$ stored in the eighth stage of the circular shift register. During the next clock cycle the first part $(1-\lambda)$ of the packet is clocked into the first stage of the first shift register and the second part $(\lambda)$ of the packet is clocked into the first stage of the circular shift register. The storage capacity of the second input stage 14 and the storage capacity of the fourth stage of the circular shift register 11 are set such the charge clocked into these stages is combined and divided by the bidirectional coupling in accordance with the relative storage capacities of these stages. The ratio of the storage capacity of the fourth stage of the circular shift register to the sum of the storage capacity of the fourth stage of the circular shift register and the storage capacity of the second input stage is also set to the fixed value $\lambda$. Accordingly, if a charge packet of unity value is clocked into the second input stage and if no charge packet is clocked into the fourth stage during the same clocking cycle, the charge packet is divided into a first part of value $(1-\lambda)$ stored in the first input stage and a second part stored in the fourth stage of the circular shift register. During the next clock cycle the first part $(1-\lambda)$ of the packet is clocked into the first stage of the second shift register and the second part $(\lambda)$ of the packet is clocked into the fifth stage of the circular shift register.

A first input sequence of charge packets $Q^+(t)$ representing positive weight components of a sequence of signal samples is applied to the first input stage and a second input sequence of charge packets $Q^-(t)$ representing negative weight components of the sequence of signal samples applied to the second input stage. Thus, each sample of an input signal is represented by the difference in magnitude of respective corresponding charge packets of the first and second sequences.

During an initial clock period a packet of charge is applied to the first input stage, and is divided into a first part $(1-\lambda)$ contained or stored in the first input stage and a second part contained or stored in the eighth stage of the circular shift register. During successive clocking cycles the first part $(1-\lambda)$ is successively split in each of the stages of the first shift register into a first portion $\alpha$ which is collected in a respective charge collecting means and a second portion $(1-\alpha)$ which is transferred to the next stage of the first shift register. Thus, for each packet of charge introduced into the first shift register successive fractions of the packet of charge are collected in successive collecting means. For each of the three stages these successive fractions are designated $h_1$, $h_2$, $h_3$, respectively. In terms of the division factors $\alpha_1$ and $\alpha_2$ of the first two stages of the first shift register the fractions $h_1$, $h_2$, and $h_3$, are as set forth in the following equations:

$$h_1 = \alpha_1 \quad (2)$$

$$h_2 = \alpha_2(1-\alpha_1) \quad (3)$$

$$h_3 = (1-\alpha_1)(1-\alpha_2) \quad (4)$$

During the first clock period the packet of charge applied to the second input stage is also divided into a first part $(1-\lambda)$ contained or stored in the second input stage and a second part $\lambda$ contained or stored in the fourth stage of the circular shift register. During successive clocking cycles the first part $(1-\lambda)$ is successively split in each of the stages of the second shift register into a first portion $\alpha$ which is collected in a respective charge collecting means and a second portion $(1-\alpha)$ which is transferred to the next stage of the second shift register. Thus, for each packet of charge introduced into the second shift register successive fractions of the packet of charge are collected in successive collecting means. For each of the three stages these successive fractions are designated $h_1$, $h_2$, $h_3$, respectively. Each of the fractions for the three stages of the second shift register is identical to the fraction of the corresponding stage of the first shift register.

The collecting means of all of the stages of the first shift register are connected in common and provide a summation signal $Q^+_{out}$ in the form of a sequence of the positive components of the samples of the output signal. The collecting means of all of the stages of the second shift register are connected in common and provide a summation signal $Q^-_{out}$ in the form of a sequence of the negative components of the samples of the output signal. The sequence of samples of the output signal is obtained by differentially summing corresponding charge packets in the two output sequences $Q^+_{out}$ and $Q^-_{out}$. This may be done in a differential amplifier 16, the $Q^+_{out}$ sequence being applied to the non-inverting terminal 17 of the amplifier and the $Q^-_{out}$ sequence being applied to the inverting terminal 18 to produce at the output terminal 19 a sequence of signal samples represented by $Q_{out}$.

Figure 2:
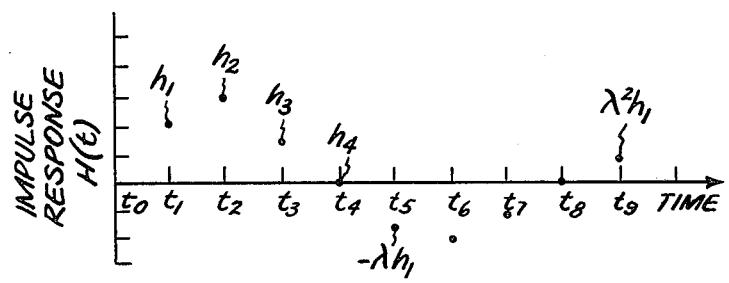
FIG. 2 shows a diagram of the impulse response of the sampled data apparatus of FIG. 1.

The response of the recursive resonator of FIG. 1 will now be described in connection with FIG. 2 for the case where a unit impulse of charge $Q_n$ is applied to the first input stage 14, and no input of charge is applied to the second input stage 15. It is assumed that the tap weights $h_1$, $h_2$ and $h_3$ of both the first and the second shift registers are set in proportion to the respective ordinates of a half sine wave at 45°, 90° and 135°, modified by multiplication by an exponential function. At time $t_o$ a first part $(1-\lambda)Q_n$ of the charge packet $Q_n$ is contained in first input stage and a second part $\lambda Q_n$ of the charge packet is contained in the eighth stage of the circular shift register. Over the clock period, $t_0-t_1$, the charge $(1-\lambda)Q_n$ is transferred to the first stage of the first shift register 12. The quantity of charge collected at the common collection means of the first shift register 12 at time $t_1$ after the first clock period $T_c$ is proportional to $h_1(1-\lambda)Q_n$, and the remaining charge is passed on to the second stage. As the common collection means is connected to the non-inverting terminal 17 of the differential amplifier 16, a positive output also proportional to $h_1(1-\lambda)Q_n$ is also obtained at the output of the differential amplifier, as shown in FIG. 2. The quantity of charge collected at the common collection means of the first shift register at time $t_2$ is proportional to $h_2(1-\lambda)Q_n$, and the remaining charge is passed on to the third stage. The output of the differential amplifier 16 is proportional to $h_2(1-\lambda)Q_n$. The quantity of charge collected at the common collection means of the first shift register at time $t_3$ is proportional to $h_3(1-\lambda)Q_n$ and the output of the differential amplifier 16 is also proportional to $h_3(1-\lambda)Q_n$. At the end of the fourth clock period $t_3-t_4$ all of the charge $(1-\lambda)Q_n$ which was transferred into the first shift register has been transferred out. Thus, the quantity of charge collected at the common collection means of the first shift register at time $t_4$ is zero and the output of the differential amplifier is also zero. Accordingly, it is seen that the amplitude of the signals appearing at the output of the differential amplifier for the time period $t_0$–$t_4$ conform to an exponentially decaying half sine wave. As tap weights $h_1$, $h_2$ and $h_3$ were set in proportion to the respective ordinates of a half sine wave at 45°, 90° and 135° modified by multiplication by an exponential function. Also over the clock periods $t_0$–$t_1$, $t_1$–$t_2$, and $t_2$–$t_3$, the charge $\lambda Q_n$ contained in the eighth stage of the circular shift register 11 is transferred successively to first, second and third stages thereof. Over the fourth clock period $t_3$–$t_4$, the charge $\lambda Q_n$ is transferred to the fourth stage of the circular shift register. At the end of the fourth period a first part $\lambda(1-\lambda)Q_n$ is contained in the second input stage 15 and a second part $\lambda^2 Q_n$ is contained in the fourth stage of the circular shift register. Over the fifth clock period, $t_4$–$t_5$, the first part $\lambda(1-\lambda)Q_n$ is transferred to the first stage of the second shift register 13. Over successive clock periods successive fractions of the first part $\lambda(1-\lambda)Q_n$ are transferred to successive stages of the second shift register. Thus, at the end of each of the next four clocking periods $t_4$–$t_5$, $t_5$–$t_6$, $t_6$–$t_7$, and $t_7$–$t_8$, each of the charge packets collected in the common collecting means of the second shift register 13 is equal to the charge packet collected at the end of a respective one of the first four clocking periods multiplied by the fraction $\lambda$. As these charges are applied to the inverting terminal 18 of the differential amplifier 16, the output obtained, as shown in FIG. 2, is a series of equally spaced samples, the amplitudes of which vary as an exponentially decaying negative half sine wave. The amplitudes of the sample are equal to $\lambda$ times the amplitudes of the positive half sine wave obtained over the period $t_0$–$t_4$. Also, over the next three clock periods $t_4$–$t_5$, $t_5$–$t_6$ and $t_6$–$t_7$ the charged $\lambda^2 Q_n$ contained in the fourth stage of the circular shift register is transferred successively to the fifth, sixth and seventh stages of the circular shift register. Over the eighth clock period, $t_7$–$t_8$, the charge $\lambda^2 Q_n$ is transferred to the eighth stage of the circular shift register. At the end of the eighth period a first part $\lambda(1-\lambda)^2 Q_n$ is contained in the first input stage and a second part $\lambda^3 Q_n$ is contained in the eighth stage of the circular shift register. Thus, it is readily apparent that the output or impulse response is that of an exponentially decaying sinusoid which may be represented by the equation:

$$Q_{out} = e^{-at} \sin bt, \quad (5)$$

where $a = -(2f_c/N) \ln \lambda$, and $b = 2\pi/8T_c$. The attenuation constant a is derived in the following manner. As described above for a full period T of the circular shift register, the decay in output is equal to $\lambda^2$. Thus, $$e^{-aT} = \lambda^2. \quad (6)$$

Noting that $T = NT_c$, and that $T_c = 1/f_c$, equation 6 is solved for a yielding $$a = -(2f_c/N) \ln \lambda. \quad (7)$$

Thus, the impulse response of the apparatus of FIG. 1 for values of $h_1$, $h_2$ and $h_3$ corresponding to an exponentially decaying half sine wave is in the form of the function f(t) of equation 1 where G(t) is an exponentially decaying half sine wave which can be written as $$G(t) = e^{-at} \sin(2\pi/T)t \text{ for } 0 < t < T/2, \quad (8)$$

The Comb function portion of equation (1) can be written as $$\sum_n e^{-at}\left[\delta(t - nT) - \delta\left(t - nT + \frac{T}{2}\right)\right], \quad (9)$$

where the attenuation constant a is given by equation 7 above.

Thus, the impulse response can be expressed as follows $$f(t) = e^{-at}\left[\delta(t - nT) - \delta\left(t - nT + \frac{T}{2}\right)\right]^* \quad (10)$$

$$\left[e^{-at} \sin \frac{2\pi}{T} t; 0 < t < \frac{T}{2}\right].$$

Figure 3:
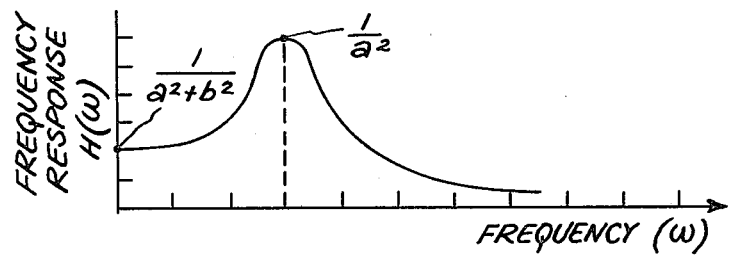
FIG. 3 shows a diagram of the frequency response of the sampled data apparatus of FIG. 1.

If additional impulses of charge were applied to the first input stage, each of the outputs would be of the same form as shown in FIG. 2 except shifted in time. Also, if the impulse of charge were applied to the second input stage, while applying no signal to the first shift register, the output obtained would be the same as shown in FIG. 2 except inverted in polarity. Thus, as any input signal applied to the first input stage can be decomposed into a sequence of impulses and also as any input applied to the second input stage can also be decomposed into a sequence of impulses, it is apparent that the response of the filter of FIG. 1 to such inputs would be simply the superposition of the responses of the filter to the individual impulses into which the input signals are decomposed. Thus, by convolving the positive weighted components and the negative weighted components of an input signal with the impulse response as shown in FIG. 2, the output from such a filter would be obtained. FIG. 3 shows the transform of the impulse response of FIG. 2.

Reference is now made to FIGS. 4–8 which show apparatus 10 in accordance with the present invention. The apparatus 10 includes a closed end or circular charge transfer shift register 11, conveniently shown as having eight stages, formed on a common substrate 22 of semiconductor material having a major surface 23. Each stage of the shift register 11 includes a respective first charge storage cell 24 adjacent the major surface 23. The first charge storage cells of the $N^{th}$ stage ($8^{th}$ stage) and the $(N/2)^{th}$ stage ($4^{th}$ stage) are composite storage cells and specifically designated as cells 24a and 24b, respectively. The packets of charge stored in each of the first charge storage cells of the circular shift register 11 are shifted or transferred to a respective adjacent first charge storage cell in one direction at a preset frequency, referred to as the clocking frequency $f_c$.

The apparatus 10 also includes a first shift register 12 of several stages, conveniently shown as three stages, formed on the substrate 22, each stage including a respective first charge storage cell 26 adjacent the major surface 23. The apparatus also includes a first input stage 14 having a composite first charge storage cell 26a unidirectionally coupled to the first stage of the first shift register 12 and bidirectionally coupled to the composite first charge storage cell 24a of the eighth stage of the circular shift register 11. Each of a first input sequence $Q^+_{in}$ of of packets of charge is introduced serially into the composite first charge storage cell 26a of the first input stage 14 and is altered in a manner which will be described below. Each of the altered charges is thereafter transferred out into the first stage of the first shift register 12 at the aforementioned frequency $f_c$.

The apparatus additionally includes a second shift register 13 of several stages, conveniently shown as three stages, formed on the substrate 22, each stage including a respective first charge storage cell 26 adjacent the major surface 23. The apparatus also includes a second input stage 15 having a composite first charge storage cell 26a unidirectionally coupled to the first stage of the second shift register 13 and bidirectionally coupled to the composite first charge storage cell 24b of the fourth stage of the circular shift register 11. Each of a second sequence $Q^-_{in}$ of packets of charge is introduced serially into the first charge storage cell of the second input stage 15 and is altered in a manner which will also be described below. Each of the altered charges is thereafter transferred out into the first stage of the second shift register 13 at the aforementioned frequency $f_c$.

At the output of the first shift register 12 a first output sequence $Q^+_{out}$ of charge packets is obtained and at the output of the second shift register 13 a second output sequence $Q^-_{out}$ of charge packets is obtained.

The composite first charge storage cell 26a of the first stage 14 comprises a first storage cell 26b having the same width as a channel region 31 of the substrate 22 included in the first stage of the first shift register 12, a region 33a of opposite conductivity type and of the same width as first storage cell 26b and contiguous therewith along its width and another first storage cell 26c also of the same width as region 33a of opposite conductivity type and contiguous therewith.

The composite first storage cell 24a of the $N^{th}$ (or eighth) stage of the circulating shift register 11 comprises a pair of first storage cells 24 and a pair of regions 34a and 34b of opposite conductivity type. One of the first charge storage cells 24 is contiguous with a side of the region 34a and the other of the first charge storage cells 24 is contiguous with a side of region 34b. The regions of opposite conductivity type 34a and 34b are connected together by conductor 34 and are also connected to region 33a of opposite conductivity type.

The composite first charge storage cell 26a of the second input stage 15 is identical to composite first charge storage cell 26a of the first input stage 14 and comprises a first storage cell 26b having the same width as the channel region 31 of the substrate 22 included in the first stage of the second shift register 13, a first region 33a of opposite conductivity type and of the same width as the first storage cell 26b and contiguous therewith along its width, and another first charge storage cell 26c, also of the same width as region 33a of opposite conductivity type and contiguous therewith.

The composite first storage cell 24b of the $(N/2)^{th}$ (or fourth) stage of the circulating shift register 11 is identical to composite first storage cell 24a of the $N^{th}$ stage thereof and comprises a pair of first charge storage cells 24 and a pair of regions 34a and 34b of opposite conductivity type. One of the first charge storage cells 24 is contiguous with a side of the region 34a and the other of the first charge storage cells 24 is contiguous with a side of region 34b. The regions of opposite conductivity type 34a and 34b are connected together by conductor 34 and are also connected to region 33a of opposite conductivity type.

While not shown, preferably the first charge storage cells 26 of the first shift register 12 should have the same storage capacity as the storage capacity of the composite storage cell 26a of the first input stage 14. Also, the first charge storage cells 26 of the second shift register 13 should have the same storage capacity as the storage capacity of the composite storage cell 26a of the second input stage 15. Similarly, the widths of the first charge storage cells 24 of the circular shift register are set so that the storage capacity thereof is the same as the storage capacity of each of composite storage cells 24a and 24b. These requirements assures that all of the first charge storage cells will have adequate capacity to carry the charge packets delivered to them.

Figure 9:
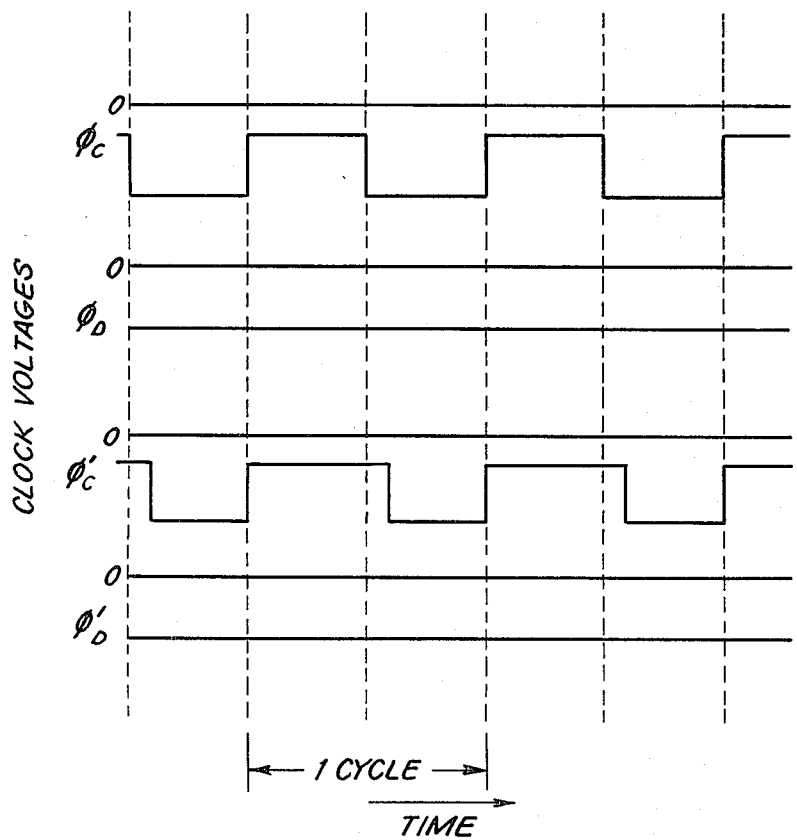
FIG. 9 is a diagram of voltage waveforms useful in describing the operation of the apparatus of FIGS. 4–8.

The transfer of charge in the first charge storage cells of the circulating shift register 11, the first shift register 12 including the first input stage 14, and the second shift register 13 including the second input stage 15 is synchronized so that charge is stored in the first charge storage cells thereof over a common interval of time which occurs when the clocking voltage $\phi_C$ of FIG. 9 is at its high level and which is recurrent at the frequency $f_c$ of the clocking voltages utilized for storing and transferring of charge in the shift registers. During each such storage interval a packet of charge is stored or contained in the first charge storage cell 24a of the circulating shift register 11. During each such interval of time, as storage cells 24a and 26a are conductively connected by conductors 34 and 35, charge in the first charge storage cell 26a combines or mixes with the charge in the first charge storage cell 24a of the circulating shift register. When the clocking voltages $\phi_C$ and $\phi_C'$ of FIG. 9 drop to their low levels, a first part of the combined charge contained in cells 26a and 24a is transferred to the second charge storage region of the first stage of the shift register 12 and a second part of the combined charge contained in cells 24a and 26a is transferred simultaneously to the second charge storage region of the first stage of the circular shift register 11. The first part of a combined packet of charge is a first fixed fraction thereof and is equal to the ratio of the width of the first charge storage cell 26a of the input stage to the sum of the width of the first charge storage cell of the input stage and the width of the first charge storage cell 24a of the circular shift register. The second part of a combined packet of charge is a second fixed fraction thereof and is equal to the ratio of the width of the first charge storage cell 24a of the circular shift register to the sum of the width of the first charge storage cell 26a of the input stage and the width of the first charge storage cell 24a of the circular shift register. Conveniently the ratio of the capacitance of the first charge storage cell 26a of the input stage to its width is set equal to the ratio of the capacitance of the first charge storage cell 24a of the circular shift register to its width. Thus, the first part of the combined charge may be considered stored or contained in the first charge storage cell 26a of the first input stage 14 and the second part of the combined charge may be considered stored or contained in the first charge storage cell 24a of the circulating shift register 11. Accordingly, the first and second fixed fractions are functions of the capacitances of the first charge storage cell 26a and the first charge storage cell 24a. In this embodiment, at the time charge is transferred out of storage cells 24a and 26a, no charge is transferred laterally along these cells and through conduction connection 35 therebetween. Such a structural organization has the practical advantage of achieving a accurate charge division of the combined charge. The manner of obtaining the fixed fractions as a function of the capacitances of the first charge storage cell 26a and the first charge storage cell 24a will be described below.

Also, over the common interval of time when the clocking voltage is at its high level charge in the first charge storage cell 24b of the fourth stage of the circular shift register is equilibrated with the charge in the first charge storage cell 26a of the second input stage 15 and divided into first and second parts in the same manner as described above in connection with first charge storage cell 26a of the first input stage 14 and first charge storage cell 24a of the eighth stage of the circular shift register.

The structure of the shift registers 11, 12, and 13, and input stages 14 and 15, and the manner of transferring and storing charge in the stages thereof will now be described. The circular shift register 11 is formed on semiconductor substrate 22 of N-type conductivity which has a pair of channel portions 41 and 42. Typically, the substrate may be silicon semiconductor material of suitable resistivity, for example, 4 ohm-cm. Overlying the major surface 23 of the substrate 22 is a thick insulating member 43 of the silicon dioxide having thin insulating portions 44a and 44b therein lying in registry with the respective channel portions 41 and 42. A plurality of first electrodes 45 are provided on the insulating member 43 overlying thin insulating portions 44a and 44b. Each of the first electrodes 45 is of uniform length in the direction of the length dimension of the channel portions 41 and 42, that is, in the direction of charge transfer. Each of the first electrodes 45 extends across both the thin insulating portion and the bordering thick insulating portions of the insulating member 43. A plurality of second electrodes 46 is provided on the insulating member 43 overlying the thin portions 44a and 44b. Each of the second electrodes 46 is of uniform length in the direction of the length dimensions of the channel portions 41 and 42 equal to the uniform length of the first electrode 45. Each of the electrodes 46 extend across both the thin insulating portions 44a and 44b and the bordering thick insulating portions of the insulating member 43. A plurality of first transfer electrodes 48 is provided over the insulating layer 47. Each of the first transfer electrodes 48 is insulatingly spaced between a respective second electrode 46 and an adjacent succeeding first electrode 45 and overlying these electrodes. A plurality of second transfer electrodes 49 is provided over the insulating layer 47. Each of the second transfer electrodes 49 is insulatingly spaced between a respective first electrode 45 and an adjacent succeeding second electrode 46 and overlying these electrodes. Each of the transfer electrodes 48 and 49 is of substantially uniform extent in the direction of the length of the channel portions 41 and 42 and extends over the thin insulating portions 44a and 44b of the insulating member 43 as well as the bordering thick insulating portions thereof.

All of the first electrodes 45 of the shift register 11 are connected to a line 51 to which $\phi_D$ voltage is supplied from a fixed voltage source 57. All of the second electrodes 46 of the shift register 11 are connected to line 52 to which a $\phi_C$ voltage is supplied from a clocking waveform generator 58. The clocking waveform generator 58 is under the control of the timing generator 59. All of the first transfer electrodes 48 of the shift register 11 are connected to a $\phi_D'$ line 53 to which a $\phi_D'$ voltage is supplied from the fixed voltage source 57. All of the second transfer electrodes 49 of the shift register 11 are connected to a $\phi_C'$ line 54 to which a $\phi_C'$ voltage is applied from clocking waveform generator 58. A conductive layer 60 of a suitable material such as gold is eutectically bonded to the lower surface of the substrate 22 to provide a substrate contact to which the ground lines of the $\phi_D$, $\phi_D'$, $\phi_C$ and $\phi_C'$ sources are connected. The $\phi_C$, $\phi_D$, $\phi_C'$, and $\phi_D'$ voltage waveforms are shown in FIG. 9. The manner in which charge is clocked or transferred from stage to stage of the circular shift register is identical to the manner of clocking charge from stage to stage of the first shift register 12 and will be described below in connection therewith.

The first charge transfer shift register 12 includes a plurality (three) of charge storage and transfer stages formed on common substrate 22. Each of the stages includes a first charge storage cell 26. The first charge storage cells 26 of successive stages form a sequence of first charge storage cells. The first charge storage cell 26 of the first stage has a width of unity. Each succeeding first charge storage cell has a width equal to or less than the respective preceding first charge storage cell 26. Each first charge storage cell 26 which has a width greater than the width of a succeeding first charge storage cell has two parts, a first part designated as a first charge storage region 27 having a width of $\alpha$ and a second part designated as a second charge storage region 28 having a width of $1-\alpha$. The second shift register 13 is identical to the first shift register 12 and identical designations are utilized for the various elements thereof. The weighting coefficients of the various stages of the first shift register are selected to provide a desired sequence of single polarity representing function G(t) as set forth in equation 1 above.

Reference is now made particularly to the first shift register 12. The first charge storage cell 26 of the first stage has a first storage region of width $\alpha_1$ and a second storage region of width $1-\alpha_1$. The first charge storage cell of the second stage has a first storage region of width $\alpha_2$ and a second storage region of width $1-\alpha_2$. The first charge storage cell of the third stage has a first storage region of width $\alpha_3$ and no second storage region as this is the last stage of the shift register. Adjacent the first storage region 27 of the first stage a first charge recovery or collection means in the form of a region of opposite conductivity 29a is provided for collection of charge flowing into the first storage region 27 of this stage. Adjacent the first storage region 27 of the second stage a second collection means 29b is provided. Adjacent the first storage region 27 of the third stage a third charge collection means 29c is provided. The charge collection means 29a, 29b, and 29c are connected together and to output terminal 30 to provide the aggregate or sum of the charge collected at each of the first three stages of the shift register. The potentials on the collection means 29a, 29b and 29c are maintained at values less than the potentials of the storage regions 26 of respective first, second and third stages of the shift register to assure collection of charge from them by connection of the output terminal 30 to a bias voltage $V_B$ through a load resistance $R_1$. A first input stage 14 is provided for receiving and processing of packets of charges supplied thereto by an input circuit 63a. As mentioned above the first input stage 14 is unidirectionally coupled to the first stage of the first shift register 12 and is bidirectionally coupled to the eighth stage of the circular shift register 11. The first input stage 14 comprises a first charge storage cell 26a of the same width as the first charge storage cell 26 of the first stage of the first shift register and coupled thereto along its width, a first region 33a of opposite conductivity type preferably shorter than the first charge storage cell 26 of the first stage of the first shift register and contiguous to the first charge storage cell 26b along its width, and another first charge storage cell 26c also of the same width as the first charge storage cell 26 of the first stage and contiguous to the region 33a of opposite conductivity type along its width.

The first shift register 12 is formed on the semiconductor substrate 22 of N-type conductivity over a channel portion 31, the lower side 33 of which is a straight and the upper side 32 of which has several steps. Overlying the major surface 23 of the substrate 22 is thick insulating member 43 of silicon dioxide having a thin portion 44 lying in registry with the channel portion 31.

A plurality of first parallel lines 45 are provided each extending generally parallel and overlying a respective one of the first charge storage cells 26. The portions of lines 45 overlying the first storage cell 26 of the first stage and also cells 26b and 26c are of the same width (and designated unity width). The portion of the line 45 overlying first storage cell 26 of the second stage is equal to $1-\alpha_1$. The portion of the line 45 also overlying first storage cell 26 of the third stage is equal to $(1-\alpha_1)(1-\alpha_2)$. The first storage region 27 and the second storage region 28 of each of the first cells of the first, second and third stages is provided by respective blocks 50 of thick insulation over which the lines 45 pass. A plurality of second parallel lines 46 are provided, each parallel to the lines 45 and interleaved therebetween. The portions of the substrate in the channel portion 31 underlying these conductors are designated the second charge storage cells. Each of the lines 45 is of uniform length in the direction of charge transfer in the channel. Similarly, each of the second lines 46 is of uniform length in the direction of charge transfer in the channel. The lines 45 and the lines 46 are spaced apart by a distance less than the length of a line 45. A thin layer of insulation 47 is provided overlying the first and second parallel lines. A plurality of third parallel lines 48 are provided overlying the insulating layer 47. Each of the third lines 48 is insulatingly spaced between a respective first line 45 and a respective preceding second line 46. A plurality of fourth parallel lines 49 are also provided overlying the insulating layer 47. Each of the fourth lines 49 is insulatingly spaced between a respective second line 46 and a respective preceding first line 45. The fourth lines 49 overlie both the second and first lines. The third and fourth lines 48 and 49 are shown in dotted outline to illustrate with clarity the structure and organization of the apparatus. The sets of four lines form a plurality of groups of electrodes, each group of electrodes being serially arranged on a respective part of the thin portion of the insulating member 43 and overlying a respective part of the channel of the shift register thereof to form with the substrate a plurality of stages of a charge transfer shift register.

The first lines 45 overling the first and second storage regions 27 and 28 of the first storage dells 26 are designated as $\phi_D$ electrodes and are connected to a common line 51 which in turn in connected to a source 57 of $\phi_D$ voltage. All of the second lines 45 overlying the second storage regions are designated as $\phi_C$ electrodes and are connected to a common line 52 which in turn is connected to a source 58 of $\phi_C$ clocking voltage. All of the transfer electrodes 48 which overlie the leading or input edge of the first storage cells 45 are designated as $\phi_D'$ electrodes and are connected to a common line 53 which in turn is connected to source 57 of voltage. All of the transfer electrodes 49 which overlie a leading or input edge of a $\phi_C$ electrode 46 are designated as $\phi_C'$ electrodes and are connected in common to a common line 54 which in turn is connected to source 58 of $\phi_C'$ voltage.

The manner in which the packets of charge are clocked into the shift register 12, transferred from stage to stage along the shift register and processed therein will now be described in connection with the diagrams of FIG. 9, which shows the clocking voltage waveform $\phi_D$, $\phi_C$, $\phi_D'$ and $\phi_C'$. Each stage of the shift register 12 includes a $\phi_D$ storage cell underlying a $\phi_D$ line 45 and a $\phi_C$ storage cell underlying a $\phi_C$ line 46. The $\phi_D$ voltage applied to the $\phi_D$ line 45 is fixed and produces a surface potential in the substrate underlying the $\phi_D$ electrode which is fixed. The $\phi_C$ voltage applied to the $\phi_C$ line cycles between a high level and a low level above and below the $\phi_D$ voltage and produces a surface potential in the substrate underlying the $\phi_C$ electrode which cycles between a level above and a level below the level underlying a $\phi_D$ electrode. When the $\phi_C$ voltage is at its high level charge transfer is enabled from the $\phi_C$ cell to the $\phi_D$ cell, and conversely when the $\phi_C$ voltage is at its low level charge transfer from the $\phi_D$ cell to the $\phi_C$ storage cell is enabled. Each stage also includes a $\phi_D'$ line 48 to which is applied a $\phi_D'$ voltage of fixed value which produces a surface potential in the substrate underlying the electrode which is smaller in absolute magnitude than the surface potential underlying a $\phi_D$ line. Each stage also includes a $\phi_C'$ electrode 49 to which is applied a $\phi_C'$ voltage having two levels. At the upper level a surface potential is produced in the substrate underlying the electrode which inhibits the transfer of charge from a $\phi_D$ storage cell to a $\phi_C$ storage cell. At the lower level a surface potential is produced enabling the transfer of charge from a $\phi_D$ storage cell to a $\phi_C$ storage cell. Thus, when the $\phi_C$ voltage is at its high level, charge is transferred from a $\phi_C$ storage cell to a $\phi_D$ storage cell and when both the $\phi_C$ voltage and the $\phi_C'$ voltage are at their low levels charge is transferred from a $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to the next succeeding $\phi_C$ storage cell.

The second shift register 13 including the clocking of charge from stage to stage thereof is identical to the first shift register 12 and corresponding elements thereof are identically designated.

Input circuits 63a and 63b are provided, each for generating a respective sequence of packets of charge corresponding to a respective sequence of signal samples. A first sequence of signal samples corresponding to the positive weight components of an input signal sequence about the same bias level is applied to the input circuit 63b. Input circuits 63a and 63b, such as referred to above, are well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 64 connected to the input circuits 63a and 63b provides a fixed bias charge component to each packet of charge developed by the input circuits 63a and 63b which facilitates the transfer thereof and permits the use of bipolar input signals. The output of the input circuit 63a is applied to a region of opposite conductivity type in the channel portion 31 of the input stage 14 of the first shift register 12 and coupled thereto. The output of the input circuit 38 is applied to another region 66 of opposite conductivity type in the channel portion 31 of the input stage 16 of the second shift register 13 and coupled thereto. Charge packets are transferred from the input circuits to opposite conductivity type regions 55 and then into the input stage by the action of clocking signals $\phi_C$ and $\phi_C'$. Alternately these charges may be transferred directly into the input stage when desired thus eliminating regions 66, or may be transferred into regions 33a of opposite conductivity type. The added input stages only add serial delay to the output but do not influence the overall frequency response of the filter.

An output circuit is provided for sensing the charge collected by the common collecting means 29a, 29b, and 29c of the first shift register 12 and for sensing the charge collected by the common collecting means 29a, 29b, and 29c of the second shift register 12 and providing an output which represents the difference of the sensed charges. To this end a bias voltage $V_B$ is applied to the common collecting means 29a, 29b, and 29c of the first shift register 12 through a first resistance $R_1$. The bias voltage $V_B$ is also applied to the common collecting means 29a, 29b, and 29c of the second shift register 13 through a second resistance $R_2$ equal to the first resistance $R_1$. The potential $V_B$ is set to provide a potential at the collecting means of each of the shift registers which is less than the surface potential of the empty first storage cells 26 thereof. The signal appearing at terminal 30 of the common collecting means 29a, 29b, and 29c of the first shift register is applied to the non-inverting terminal 17 of a differential amplifier 16. The signal appearing at the terminal 30 of the common collecting means 29a, 29b, and 29c of the second shift register 13 is applied to the inverting terminal 18 of the differential amplifier 16. Thus, at the output terminal 19 of the differential amplifier 16 a signal $V_{out}$ is obtained which is the difference of the charges appearing at the common collecting means of the first and second shift registers.

In the operation of the apparatus of FIGS. 4-8 a sequence of packets of charge, each corresponding to a respective positive weight component of a signal is obtained from input circuit 63a, is supplied to the first input stage 14 wherein each packet is combined with the packet contained in the eighth stage of the circular shift register 11 and the combined packet is constituted of or divided into a first part contained in the first input stage 14 and a second part contained in the eighth stage of the circular shift register. The first part of the combined charge is supplied to the first stage of the first shift register 12, and is serially clocked from stage to stage thereof. At the first, second and third stages, packets of charge corresponding to weighting coefficients $h_1$, $h_2$ and $h_3$ are collected and appear at common collection means 29a, 29b and 29c. The second part of the combined charge is serially clocked from stage to stage of the circular shift register. Also, a second sequence of packets of charge, each corresponding to a respective negative weight component of the signal, is obtained from input circuit 63b, is supplied to the second input stage 15 wherein each packet is combined with the packet contained in the fourth stage of the circular shift register and the combined packet is constituted of or divided into a first part contained in the second input stage and a second part contained in the fourth stage of the circular shift register. The first part of the combined charge is supplied to the first stage of the second shift register 13 and is clocked from stage to stage thereof. At the first, second and third stages, packets of charge corresponding to weighting coefficients $h_1$, $h_2$ and $h_3$ are collected at the common collection means 29a, 29b and 29c. The second part of the combined charge is serially clocked from stage to stage of the circular shift register. An output is obtained at terminal 30 of each of the shift registers 12 and 13 which is the sum of the outputs to the first, second and third collection means thereof at the end of each of the clock cycles. As described in connection with FIG. 1, the output appearing at the output terminal 30 of the first shift register 12 is a sequence of packets of charge, each packet representing a respective positive weight components of a series or sequence of samples of an output signal. This sequence of packets develops a voltage across resistance $R_1$ which is applied to the noninverting terminal 17 differential amplifier 16. Also, the output appearing at the output terminal 30 of the second shift register 13 represents a second sequence of packets of charge, each representing a respective negative weight component of the sequence of samples of the output signal. This sequence of packets develops a voltage across resistance $R_2$ which is applied to the inverting terminal 18 of differential amplifier 16. The difference of corresponding elements or values of the first and negative sequences is obtained at the output terminal 19 of the differential amplifier 16. As described in connection with FIG. 1 the sequence of output values represents the convolution of a Comb function with an arbitrary sequence of a single polarity.

The attenuation constant a of equation 7 will now be derived in terms of the physical structure shown in FIGS. 4-8. First, the fractions of charge division will be determined. The fraction of charge contained in the first storage cell 26a of the first input stage 12 after equilibration with the charge in the first charge storage cell 24a of the eighth stage of the circular shift register and division thereof described above is a function of the capacitances of the storage cells 26a and 24a. The capacitance $C_1$ of cell 26a is equal to parallel combination of the dielectric capacitance of storage cell 26b with respect to the overlying clocking electrode, the dielectric capacitance of 26c with respect to the overlying clocking electrode, the depletion capacitances of cells 26b and 26c, and the depletion capacitance of the region 33a with respect to the substrate. The depletion capacitances are relatively small in relation to the dielectric capacitances of the storage cells 26b and 26c and will be initially ignored. Similarly, capacitance $C_2$ of the composite cell 24a of the circulating shift register 11 is equal to the parallel combination of the dielectric capacitances of the two storage cells 24 contiguous to regions 34a and 34b of opposite conductivity type, the depletion capacitances of these two storage cells 24, and the depletion capacitance of the regions 34a and 34b of opposite conductivity type with respect to the substrate. The depletion capacitances are relatively small in relation to the dielectric capacitances of the storage cell 24 and will also be initially ignored. As the dielectric capacitance is independent of quantity of charge stored in the storage cells, the proportion of total or combined charge $Q_T$, after equilibration and division of the combined charge, contained in the storage cell 26a is $(C_1/(C_1+C_2)) Q_T$ and the proportion of charge contained in storage cell 24a is $(C_2/(C_1+C_2)) Q_T$. Thus, the fraction of the total charge $Q_T$ contained in the storage cell 26a is $C_1/(C_1+C_2)$, and the fraction of the total charge contained in the storage cell 24a is $C_2/(C_1+C_2)$. While depletion capacitance varies with the quantity of charge stored, it can be made largely independent of stored charge as well, if desired. See, for example patent application Ser. No. 952,413 filed Oct. 18, 1978, now U.S. Pat. No. 4,240,089 assigned to the assignee of the present invention and incorporated hereby by reference thereto. Accordingly, depletion capacitances do not have to be ignored and may be included in the calculation of the fixed fraction, if precise values are desired. Of course, if particular fixed fractions are desired, additional dielectric capacitance may be added to the capacitance of either storage cell 26a or 24a.

Consider the response of the apparatus when a single charge packet is applied to the first input stage 14. Assume at the beginning of the first clock cycle a quantity of charge $Q_n$ is stored in the first charge storage cell 24 of the first stage of the circular shift register 11. At the end of the $(N/2)^{th}$ or fourth clock cycle a quantity $(C_2/(C_1+C_2)) Q_n$ remains in the first charge storage cell of the fourth stage of the circular shift register. At the end of the $N^{th}$ or eighth clock cycle a quantity of charge $(C_2/(C_1+C_2))^2 Q_n$ remains in the first cell of the eighth stage. Thus, $$(C_2/(C_1+C_2))^2 Q_n = e^{-aT} Q_n, \tag{11}$$

where T is the period of charge in the circular shift register 11 and a is the attenuation constant. Solving equation (11) for a yields:

$$a = \frac{2}{T} \ln \frac{C_1 + C_2}{C_2}, \tag{12}$$

or $$a = \frac{2f_c}{N} \ln \frac{C_1 + C_2}{C_2},$$

where $N/f_c = T$.

Packets of charge as they are clocked from storage region to storage region in a charge transfer shift register are insensitive to capacitive pick-up voltages provided that potentials of the storage regions and the transfer regions therebetween are set so that charge transfer can take place efficiently. However, when minority carrier charge is introduced on a region of opposite conductivity type in the substrate, the charge is no longer insensitive to pick-up voltages. In the implementation of circuits such regions of opposite conductivity type, conveniently referred to as "diffusion runs", must be short and small, and avoid overlying lines which can produce extraneous potentials and affect the charge transferred therefrom. Also, in any charge transfer device for efficient charge transfer the total capacitance of the storage regions should be comparable. Accordingly, a diffusion run associated with a storage region and hence the capacitance it adds to the total capacitance thereof should be small. In applicants apparatus the regions 33a and 34b of opposite conductivity type are kept small. Also, the region 33a of opposite conductivity type in the first input stage 14 is closely placed to regions 34a and 34b of the circulating shift register 11. Regions 34a and 34b are connected by a conductive line 34. Region 33a is connected to conductive line 34 by conductive line 35. In addition the regions 33a, 34a, 34b, and connecting lines 34 and 35 are clear of any overlying lines. Accordingly, the aforementioned requirements are met.

Another feature of the present invention is the reorganization of the parts of two shift registers of the aforementioned patent application Ser. No. 105,757 into a circulating shift register and two different shift registers to provide superior performance. A particular advantage of such reorganization is a compact and efficient organization of elements making possible short and small diffusion runs free of overlying lines with resultant improvements in the operation thereof. The circulating shift register 11 is disposed between the upper or positive signal component channel and the lower or negative signal component channel. The regions 33a and 34a and 34b are juxtaposed so that the bidirectional coupling provided by elements 34, 34a, and 34b between storage cells 26 and 24 introduces only a small capacitance compared to the capacitance represented by storage cells 24 and 26.

While input circuits 37 and 38 are provided to convert an input signal into a positive weight sequence and a negative weight sequence for application to the first and second shift registers 12 and 13, if the positive weight and negative weight input sequences are in the form sequences of charge packets they may be directly applied to the input sections of the first and second shift registers without the necessity of converting a signal into positive weight and negative weight charge sequences.

In the embodiment of FIG. 4 the ratio of the capacitance $C_1$ of the first charge storage cell 26a to the width $W_1$ of channel 31 of the first shift register 12 is set equal to the ratio of the capacitance $C_2$ of the first charge storage cell 24a to the width $W_2$ of channel 41 or 42 of the circular shift register. Also, the ratio of the capacitance $C_1$ of the first charge storage cell 26a to the width $W_1$ of channel 31 of the second shift register 12 is set equal to the ratio of the capacitance $C_2$ of the first charge storage cell 24b to the width $W_2$ of the channel 41 or 42 of the circular shift register. With this specific organization the attenuation constant a is given by equation 12, namely:

$$a = 2f_c/N \ln[(C_1+C_2)/C_2].$$

However, the capacitance $C_1$ and $C_2$ do not have to be proportioned as specified above. In that case the attenuation constant would be given by the following equation:

$$a = 2f_c/N \ln[(W_1+W_2)/W_2]. \tag{13}$$

Figure 10:
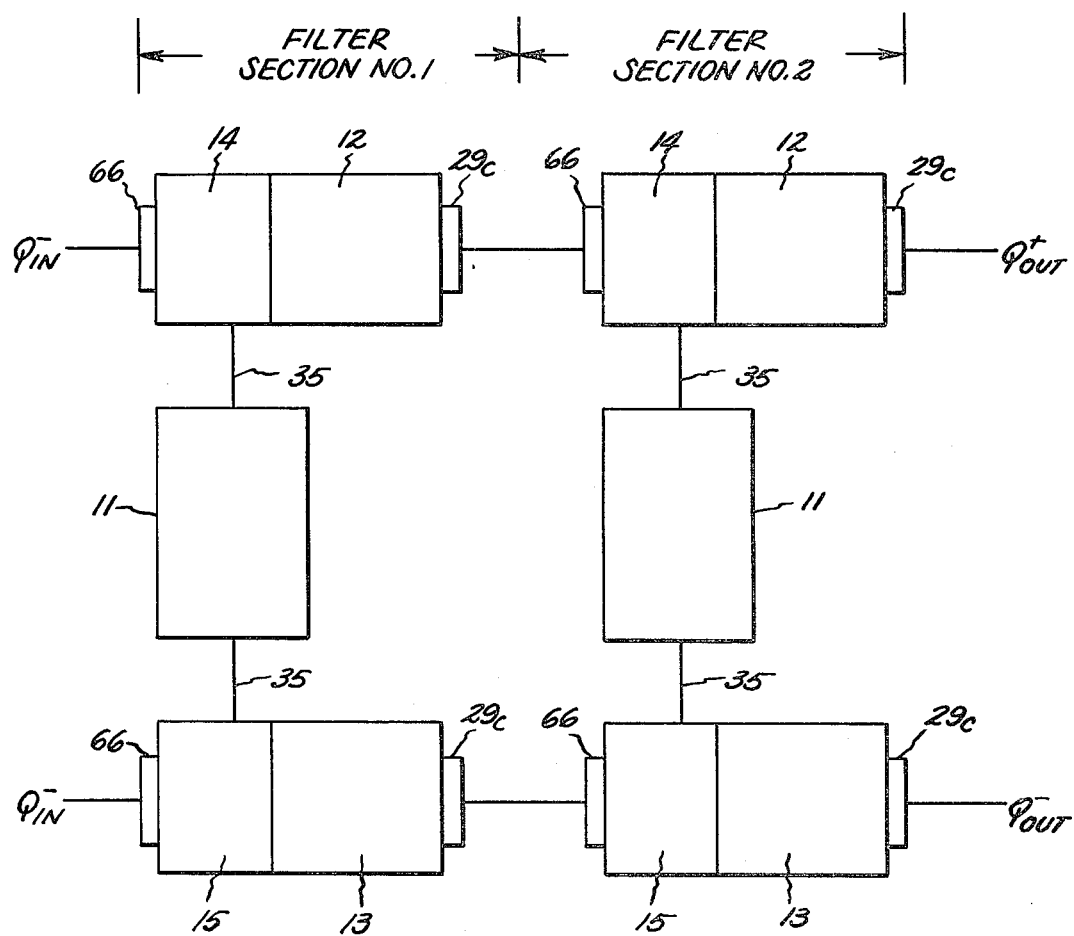
FIG. 10 is a block diagram showing the cascading of sample data apparatus of the present invention.

Reference is now made to FIG. 10 which is a block diagram illustrating the manner in which two identical filter sections, each identical to the filter of FIG. 4 and comprising a circulating shift register 11, a first shift register 12, and a second shift register 13, are cascaded. Each filter section includes a region 66 of opposite conductivity type associated with input stage 14 to which a first input sequence of packets of charge representing positive weight components of an input signal sequence is applied and another region 66 of opposite conductivity type associated with input stage 15 to which a second input sequence of packets of charge representing negative weight components of the input signal sequence is applied. Each filter section includes a region 29c of opposite conductivity type associated with the first shift register 12 from which a first output sequence of packets of charge is obtained representing the positive weight components of the output signal and another region 29c of opposite conductivity type associated with the second shift register 13 representing the negative weight components of the output signal. The output region 29c of the first shift register 12 of the filter section No. 1 is conductively connected to the input region 66 of the first input stage 14 of filter section No. 2, and the output region 29c of the second shift register 13 of filter section No. 1 is conductively connected to the input region 66 of the second input stage 15 of filter section No. 2. Thus, to cascade the filter sections a conductive connection is made between each of the output regions 29c of one filter section with the respective one of input regions 66 of the next filter section. This is possible as the output and input signal sequences are in the form charge packets.

To cascade the filter of FIG. 4 with another similarly constituted filter the positive weight output on region 29c from the first shift register 12 would be connected directly to the input section of the positive weight shift register or channel of the succeeding filter, for example, connection would be made to a similarly constituted region of opposite conductivity type, and also the negative weight output on region 29c from the second shift register 13 would be connected directly to input section of the negative weight shift register or channel of the succeeding filter.

While lengths of first storage cell 26b, region 33a, and first storage cell 26c in the direction of charge transfer are shown as of the same length as the length of the first storage cells 15 for reasons of simplicity in illustrating and describing the apparatus, they are not required to be of such length. Both first cells 26b and 26c can be shorter in length than the length of a first charge storage cell 26. In general, first storage cell 26c would be shorter. The length of region 33a should be minimal consistent with good conductivity.

The charge division ratios ($\alpha$'s) for each stage and hence the weighting coefficient (h's) for each of the stages are selected to provide the desired impulse response in accordance with equation 1. Of course, while only three stages were shown in the filters of FIG. 4, any number may be utilized.

While the filter of FIG. 4 utilizes charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices, are described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes. In the apparatus of the present invention such nonlinearities are not introduced into the output. In connection with a buried channel implementation, of course, surface charge input circuits, such as those described above, could be used.

Figure 5:
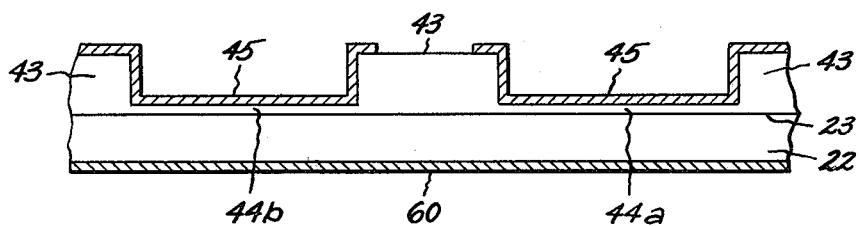
FIG. 5 is a sectional view of the embodiment of FIG. 4 taken along section lines 5—5 thereof.
Figure 6:
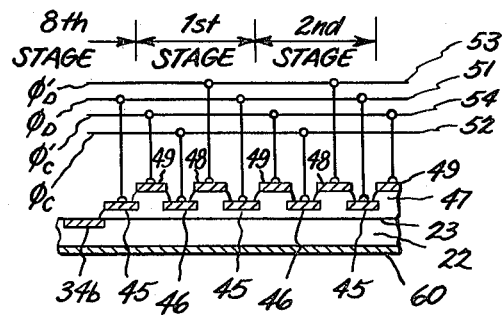
FIG. 6 is a sectional view of the embodiment of FIG. 4 taken along sectional lines 6—6 thereof.
Figure 7:
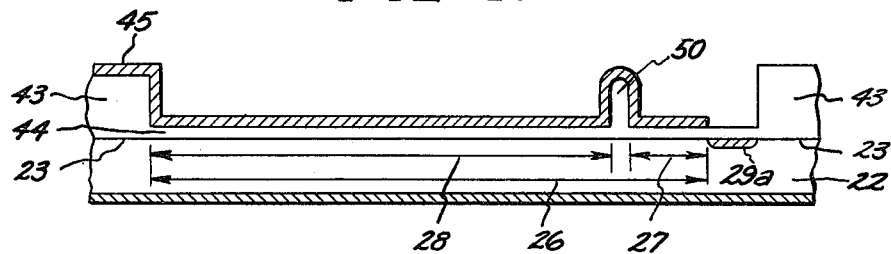
FIG. 7 is a sectional view of the embodiment of FIG. 4 taken along section lines 7—7 thereof.
Figure 8:
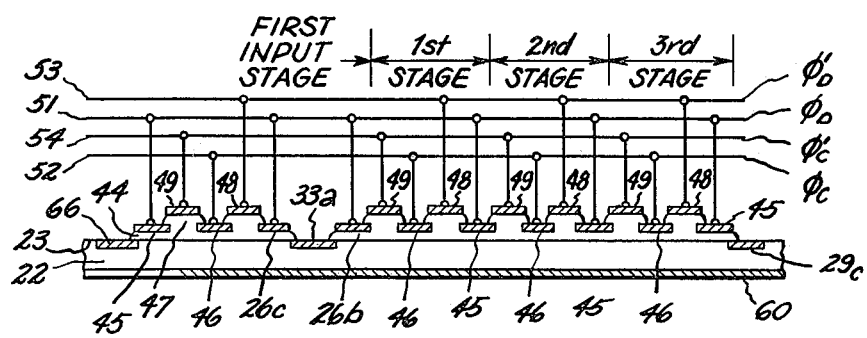
FIG. 8 is a sectional view of the embodiment of FIG. 4 taken along section lines 8—8 thereof.

The filter apparatus of the present invention may also be implemented in bucket brigade technology; however, such implementation would be less advantageous than in the charge coupled technology shown and described in FIGS. 4-6, as bucket brigade devices are subject to charge transfer inaccuracies which limit their performance.

While charge division has been described where a single packet of charge is divided into two or more packets during the charge transfer operation, other means of dividing charge may be utilized in the apparatus of the present invention. Such charge division means are described in U.S. Pat. Nos. 4,124,861 and 4,124,862, both assigned to the assignee of the present invention and incorporated herein by reference.

While the invention has been described in specific embodiments in which single phase clocking systems have been employed, it will be understood that other clocking systems such as multi-phase clocking systems may as well be employed.

While the invention has been described in connection with apparatus constituted of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. Charge transfer apparatus comprising
  a plurality of first charge storage cells arranged in a sequence,
  means for dividing each of said first charge storage cells into a plurality of parts such that the ratio of the charge stored within a first part thereof to the sum of the charges stored within all of the parts thereof is equal to a respective one of a sequential series of predetermined values,
  said sequential series of predetermined values corresponding to a series of weighting coefficients, each weighting coefficient for a respective first charge storage cell,
  said plurality of first charge storage cells being serially coupled to form a plurality of stages of a first charge transfer shift register, each stage including a respective first charge storage cell,
  a plurality of collection means, each collection means coupled to the first part of a respective first charge storage cell for collecting charge stored therein, selected ones of said plurality of collection means being connected in common,
  an input stage including a first charge storage cell coupled to the first stage of said first shift register,
  means for providing an input sequence of packets of charge, each packet representing a respective sample of a first signal,
  introduction means for sequentially introducing into the first charge storage cell of said input stage at one frequency each of said packets of charge of said first input sequence, a circular shift register having a plurality of stages, each stage including a first charge storage cell, means for transferring charge packets from first charge storage cell to first charge storage cell at said one frequency and in one direction in said circular shift register, said introduction means being synchronized to provide storage of charge packets in the first charge storage cells of said input stage, said first shift register and said circular shift register over a common interval of time, recurrent at said one frequency, combining means including a conductive connection between the first charge storage cell of said input stage and one of the first charge storage cells of said circular shift register for combining the charge packet in said first charge storage cell of said input stage with the charge packet in said one first charge storage cell of said circuit shift register during each of said common intervals of time to form a respective combined packet of charge, transferring means for periodically transferring at said one frequency a first part of each of said combined packets of charge to the first charge storage cell of the first stage of said first shift register and for simultaneously transferring at said one frequency a second part of each of said combined packets of charge to the stage of said circular shaft register succeeding said one stage thereof, the capacitance of said first charge storage cell of said input stage being equal to the capacitance of said first charge storage cell of said first stage of said first shift register, the capacitance of said one first charge storage cell of said circular shift register being equal to the capacitance of the first charge storage cell of the succeeding stage of said circular shift register, said first part of a combined packet of charge being equal to a first fixed fraction, said first fixed fraction being equal to the ratio of the capacitance of said first charge storage cell of said input stage to the sum of the capacitance of said first charge storage cell of said input stage and the capacitance of said one first charge storage cell of said circular shift register, means for transferring said first parts of charge from stage to stage of said first shift register including transferring to each of said collection means of said first shift register a respective portion of each of said first parts of charge, said second part of a combined packet of charge being equal to a second fixed fraction, said second fixed fraction being equal to the ratio of the capacitance of said one first charge storage cell of said circular shift register to the sum of the capacitance of said first charge storage cell of said input stage and the capacitance of said one first charge storage cell of said circular shift register, whereby an output sequence of packets of charge is collected by said collection means connected in common, said output sequence of packets representing the filtered response of said first shift register and said circulating shift register to said input sequence of packets.

2. The charge transfer apparatus of claim 1 in which said circular shift register includes a plurality of N stages, where N is an even number greater than 2.

3. The charge transfer apparatus of claim 2 in which said first shift register consists of $(N/2-1)$ stages.

4. The apparatus of claim 1 in which said first charge storage cells of said first shift register and said circular shift register are formed in a substrate of semiconductor material.

5. The apparatus of claim 1 in which said first charge storage cells of said first shift register and said circular shift register are formed adjacent a major surface of a substrate of semiconductor material.

6. The apparatus of claim 5 in which said first fixed fraction is equal to the ratio of the width of said first charge storage cell of said input stage to the sum of the width of said first charge storage cell of said input stage and the width of the first charge storage cell of said one stage of said circular shift register, and in which said second fixed fraction is equal to the ratio of the width of the first charge storage cell of said one stage of said circular shift register to the sum of the width of said first charge storage cell of said input stage and the width of the first charge storage cell of said one stage of said circular shift register.

7. Charge transfer apparatus comprising a first plurality of first charge storage cells arranged in a sequence, means for dividing each of said first charge storage cells of said first plurality into a plurality of parts such that the ratio of the charge stored within a first part thereof is equal to a respective one of a first sequential series of predetermined values, said first sequential series of predetermined values corresponding to a first series of weighting coefficients, each weighting coefficient for a respective first charge storage cell, said first plurality of first charge storage cells being serially coupled to form a first plurality of stages of a first charge transfer shift register, each stage including a respective first charge storage cell, a first plurality of collection means, each collection means coupled to the first part of a respective first charge storage cell of said first plurality for collecting charge stored therein, selected ones of said first plurality of collection means being connected in common, a first input stage including first charge storage cell coupled to the first stage of said first shift register, means for providing a first input sequence of packets of charge, each packet representing a respective positive weight component of a sample of a signal, first introduction means for introducing into the first charge storage cell of said first input stage at one frequency each of said packets of charge of said first input sequence, a circular shift register having N stages, where N is an even number greater than two, each stage including a first charge storage cell, means for transferring charge packets from first charge storage cell to first charge storage cell of said one frequency and in one direction in said circular shift register, said first introduction means being synchronized to provide storage of charge packets in the first charge storage cells of said first input stage, said first shift register and said circular shift register over a common interval of time, recurrent at said one frequency, first combining means including a conductive connection between the first charge storage cell of the $N^{th}$ stage of said circular shift register for combining the charge packet in said first charge storage cell of said first input stage with the charge packet in the first charge storage cell of the $N^{th}$ stage of said circular shift register during each of said common intervals of time to form a respective combined packet of charge, first transferring means for periodically transferring at said one frequency a first part of each of said combined packets of charge to the first charge storage cell of the first stage of said first shift register and for simultaneously transferring to said one frequency a second part of each of said combined packets of charge to the first stage of said circular shift register, the capacitance of said first charge storage cell of said first input stage being equal to the capacitance of said first charge storage cell of said first stage of said first shift register, the capacitance of said first charge storage cell of said $N^{th}$ stage of said circular shift register being equal to the capacitance of the first charge storage cell of said first stage of said circular shift register, said first part of a combined packet of charge being equal to a first fixed fraction, said first fixed fraction being equal to the ratio of the capacitance of said first charge storage cell of said first input stage to the sum of the capacitance of said first charge storage cell of said first input stage and the capacitance of the first charge storage cell of the $N^{th}$ stage of said circular shift register, said second part of a combined packet of charge being equal to a second fixed fraction, said second fixed fraction being equal to the ratio of the capacitance of the first charge storage cell of the $N^{th}$ stage of said circular shift register to the sum of the capacitance of said first charge storage cell of said first input stage and the capacitance of the first charge storage cell of the $N^{th}$ stage of circular shift register, means for transferring said first parts of charge from stage to stage of said first shift register including transferring to each of said collection means of said first shift register a respective portion of each of said first parts of charge, whereby a first output sequence of packets of charge is collected by said collection means of said first plurality connected in common, said first output sequence of packets representing the filtered response of said first shift register and said circulating shift register to said first input sequence of packets, a second plurality of first charge storage cells arranged in a sequence, means for dividing each of said first charge storage cells of said second plurality into a plurality of parts such that the ratio of the charge stored within a first part thereof to the sum of the charges stored within all of the parts thereof is equal to a respective one of a second sequential series of predetermined values, said second sequential series of predetermined values corresponding to a second series of weighting coefficients, each weighting coefficient for a respective first charge storage cell, said second plurality of first charge storage cells being serially coupled to form a second plurality of stages of a second charge transfer shift register, each stage including a respective first charge storage cell, a second plurality of collection means, each collection means coupled to the first part of a respective first charge storage cell of said second plurality for collecting charge stored therein, selected ones of said second plurality of collection means being connected in common, a second input stage including a first charge storage cell coupled to the first stage of said second shift register, means for providing a second input sequence of packets of charge, each packet representing a respective negative weight component of a sample of said signal, second introduction means for introducing into the first storage cell of said second input stage at said one frequency packets of charge of said second input sequence, said second introduction means being synchronized to provide storage of charge packets in the first charge storage cells of said second input stage, said second shift register and said circular shift register over said common interval of time, recurrent at said one frequency, second combining means including a conductive connection between the first charge storage cell of said second input stage and the first charge storage cell of the $(N/2)^{th}$ stage of said circular shift register for combining the charge packet in said first charge storage cell of said second input stage with the charge packet in the first charge storage cell of the $(N/2)^{th}$ stage of said circular shift register during each of said common intervals of time to form a respective combined packet of charge, second transferring means for periodically transferring at said one frequency a first part of each of said combined packets of charge to the first charge storage cell of the first stage of second shift register and for simultaneously transferring at said one frequency a second part of each of said combined packets of charge to the stage of said circular shift register succeeding said $(N/2)^{th}$ stage thereof, the capacitance of said first charge storage cell of said second input stage being equal to the capacitance of said first charge storage cell of said first stage of said second shift register, the capacitance of said first charge storage cell of said $(N/2)^{th}$ stage of said circular shift register being equal to the capacitance of the first charge storage cell of the succeeding stage of said circular shift register, said first part of a combined packet of charge being equal to said first fixed fraction, the ratio of the capacitance of said first charge storage cell of said second input stage to the sum of the capacitance of said first charge storage cell of said second input stage and the capacitance of the first charge storage cell of the $(N/2)^{th}$ stage of said circular shift register being equal to said first fixed fraction, said second part of a combined packet of charge being equal to said second fixed fraction of a combined packet of charge, the ratio of the capacitance of the first charge storage cell of the $(N/2)^{th}$ stage of said circular shift register to the sum of the capacitance of said first charge storage cell of said second input stage and the capacitance of the first charge storage cell of the $(N/2)^{th}$ stage of said circular shift register being equal to said second fixed fraction, means for transferring said first parts of charge from stage to stage of said second shift register including transferring to each of said collection means of said second shift register a respective portion of each of said first parts of charge, whereby a second output sequence of packets of charge is collected by said collection means of said second plurality connected in common, said second output sequence of packets representing the filtered response of said second shift register and said circulating shift register to said second input sequence of packets.

8. The charge transfer apparatus of claim 7 in which said first and second shift registers each consist of $(N/2-1)$ stages.

9. The charge transfer apparatus of claim 7 in which corresponding values of said first sequential series of values and said second sequential series of values are identical.

10. The apparatus of claim 7 in which is provided means for deriving signal samples each of which represents the difference of the charge collected by said first collection means of said first plurality connected in common and the charge collected by said first collection means of said second plurality connected in common.

* * * * *